(12) United States Patent
Nonaka

(10) Patent No.: US 8,365,124 B2
(45) Date of Patent: Jan. 29, 2013

(54) CIRCUIT DESIGN DEVICE FOR CONDUCTING FAILURE ANALYSIS FACILITATING DESIGN

(75) Inventor: Junpei Nonaka, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 202 days.

(21) Appl. No.: 12/588,991

(22) Filed: Nov. 4, 2009

(65) Prior Publication Data

US 2010/0115485 A1 May 6, 2010

(30) Foreign Application Priority Data

Nov. 5, 2008 (JP) ................................ 2008-284660

(51) Int. Cl.
*G06F 17/50* (2006.01)
(52) U.S. Cl. ........................................ 716/119; 716/136
(58) Field of Classification Search ................. 716/119, 716/136
See application file for complete search history.

(56) References Cited

U.S. PATENT DOCUMENTS

| 7,600,203 B2* | 10/2009 | Nonaka | ..................... | 716/136 |
| 2007/0113127 A1* | 5/2007 | Nonaka | ..................... | 714/724 |
| 2008/0091987 A1 | 4/2008 | Nonaka | | |
| 2009/0199137 A1* | 8/2009 | Huckabay et al. | ................. | 716/4 |

FOREIGN PATENT DOCUMENTS

JP 2007-122422 5/2007

OTHER PUBLICATIONS

Shinomiya, et al., "Evaluation of Diagnosability in Test Point Inserted Logic BIST Circuit", LSI Testing Symposium/2005, Fault Diagnosis Algorithm/System, Nov. 10, 2005.

* cited by examiner

*Primary Examiner* — Vuthe Siek
*Assistant Examiner* — Mohammed Alam
(74) *Attorney, Agent, or Firm* — McGinn IP Law Group, PLLC

(57) ABSTRACT

A circuit design device decides placement of elements and interconnections included in a circuit, on the basis of connection information of the circuit. The circuit design device includes an equivalent fault class extracting unit, a weighting unit, and a placement deciding unit. The equivalent fault class extracting unit extracts one or more classes (hereinbelow referred to as "equivalent fault classes") having, as members, interconnections (hereinbelow referred to as "equivalent fault interconnections") which mutually cause an equivalent fault in the circuit. The weighting unit gives a greater weight to the equivalent fault class or the equivalent fault interconnections included in the equivalent fault class, as the number of the members in the equivalent fault class (hereinbelow referred to as the "number of equivalent fault interconnections") increases. The placement deciding unit decides placement of the elements and the interconnections so that, among the equivalent classes, an equivalent fault class having a larger number of equivalent fault interconnections would have a lower probability of including a single stuck-at fault.

24 Claims, 6 Drawing Sheets

FIG. 7
|  | NUMBER OF ELEMENTS | NUMBER OF NODES |
|---|---|---|
| CIRCUIT 1 | 2710 | 2650 |
| CIRCUIT 2 | 18341 | 18759 |
FIG. 8A
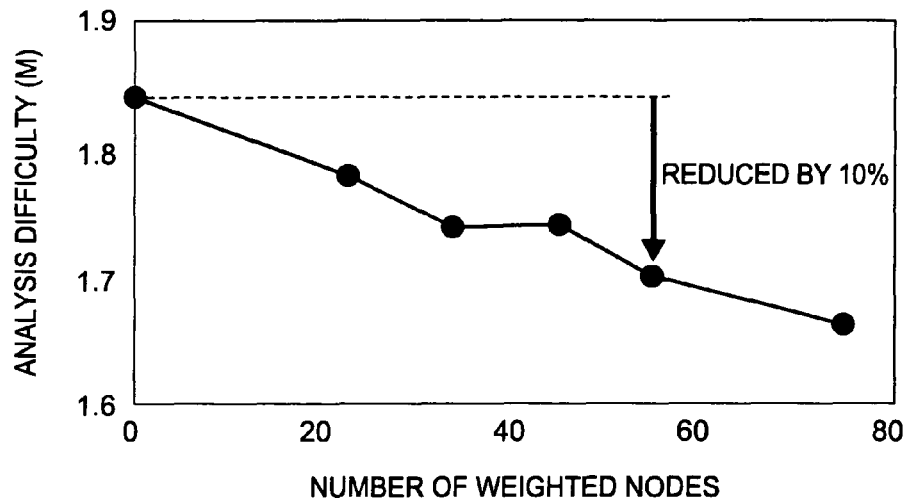
FIG. 8B
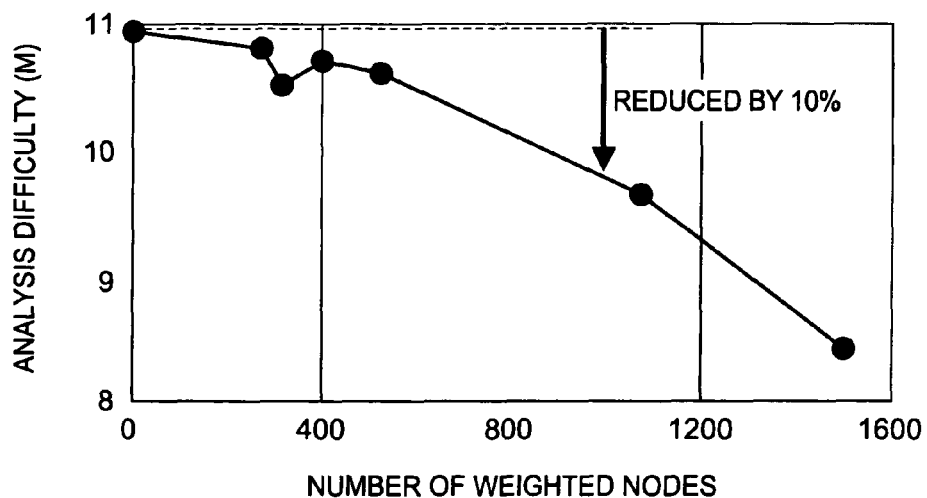

CIRCUIT DESIGN DEVICE FOR CONDUCTING FAILURE ANALYSIS FACILITATING DESIGN

INCORPORATION BY REFERENCE

This application is based upon and claims the benefit of priority from Japanese Patent Application No. 2008-284660 which was filed on Nov. 5, 2008, the disclosure of which is incorporated herein in its entirety by reference.

BACKGROUND OF THE INVENTION

1. Field of the Invention

The present invention relates to a circuit design device, and particularly relates to a circuit design device for an ASIC that is one type of semiconductor integrated circuits, and to a circuit design device for facilitating a failure analysis.

2. Description of Related Art

Semiconductor integrated circuits manufactured in a manufacturing process of semiconductor integrated circuits include defective products. Thus, the defective products are eliminated in a test process and only non-defective products are shipped. Here, a rate of the non-defective products at this time is referred to as a yield. In order to enhance the yield, it is necessary to clarify a cause for a failure by a failure analysis and improve the manufacturing process.

However, with miniaturization of the semiconductor integrated circuits in recent years, the failure analysis has been becoming more and more difficult. This is because the resolution of a failure analysis device is not high enough for the element size of the miniaturized semiconductor integrated circuit. Conventionally-used failure-analysis devices include optical failure-analysis devices such as an emission microscope, an OBIRCH (Optical Beam Induced Resistance CHange) device, and an LVP (Laser Voltage Probe). However, using light in an infrared region, these optical failure-analysis devices cannot obtain a resolution of sub-microns or smaller due to the effect of a diffraction limit.

Devices having a higher resolution than the optical failure-analysis devices described above include an electron beam (EB) analyzer. To use the EB analyzer, an electron beam should be emitted directly onto a target interconnection to be analyzed. However, in recent years, as the number of interconnection layers has increased, and the target interconnections to be analyzed are often not exposed, application of the EB analyzer is difficult.

Meanwhile, a fault diagnosis of estimating a fault part on the basis of a result of an LSI test, such as a scan test, has been widely used for a semiconductor integrated circuit, especially for an ASIC (Application Specific Integrated Circuit). However, when a fault part includes many equivalent faults, the fault diagnosis cannot identify a true fault part and extracts multiple fault candidates. When multiple fault candidates are extracted, a true fault part needs to be identified from the multiple fault candidates. To this end, target interconnections to be measured need to be exposed by using a focused ion beam (FIB) device. After the interconnection exposure process is performed, measurement using the EB analyzer is carried out. However, if the number of fault candidates is large, then enormous man-hours are necessary, and thus the failure analysis work takes huge time.

As one of designs for testability (DFT) which facilitates a failure analysis, test point insertion (TPI) is known. In TPI, in order to enhance testability (controllability, observability), a register called a test point is inserted into a target circuit to be designed (see Patent Document 1, for example).

Patent Document 1 describes a circuit design system of the present inventor. With the circuit design system described in Patent Document 1, failure analysis can be efficiently improved even with a fewer observation points by setting optimal insertion positions for observation points (test points).

[Patent Document 1] Japanese Patent Application Laid Open No. 2007-122422 (U.S. Patent Application Publication No. US 2008/0091987)

FIG. 3 of Patent Document 1 shows a configuration of the circuit design system. With reference to FIG. 3 of Patent Document 1, the circuit design system includes an input unit 101, a storage unit 103, a circuit placing unit 105, an inter-cell distance extracting unit 107, a fault candidate extracting unit 109, a judgment unit 111, an observation point inserting unit 113, a circuit routing unit 115, and an output unit 117. The judgment unit 111 includes a failure analyticity evaluating unit 119 and an insertion position deciding unit 121. The failure analyticity means ease or facility of the failure analysis.

The operation of the circuit design system is as follows. First, the input unit 101 inputs a netlist NET and stores it in the storage unit 103. A logic circuit has such a configuration that small circuit elements (hereinafter referred to as "cells") are interconnected through interconnections (hereinafter referred to as "nodes"), and a relation of connection between the circuit elements is described in the netlist NET. Next, the circuit placing unit 105 refers to the netlist NET and performs placement of cell groups. The circuit placing unit 105 stores in the storage unit 103 cell placement data ARR indicating the cell placement, and outputs it to the inter-cell distance extracting unit 107. The inter-cell distance extracting unit 107 refers to the placement data ARR, and extracts and calculates information on the inter-cell distance. The inter-cell distance extracting unit 107 outputs inter-cell distance data DIS indicating the inter-cell distance, to the judgment unit 111.

The fault candidate extracting unit 109 refers to the netlist NET and extracts an equivalent fault group (also referred to as an "equivalent fault class"). An equivalent fault group refers to a group which is formed of multiple fault candidates that are equivalent to each other. In addition, a fault part in the equivalent fault group cannot be identified by measurement from outside. Here, we assume an example where equivalent fault groups G1, G2, . . . , and GI (I is an integer equal to or greater than 1) are extracted. Each equivalent fault group Gi (i=1, 2, . . . , and I) includes multiple equivalent fault nodes (also referred to as "equivalent fault interconnections") Ni1, Ni2, . . . , and NiJi. Here, Ji is the number of equivalent fault nodes (hereinafter referred to as the "number of equivalent fault nodes" or the "number of equivalent fault interconnections") included in the equivalent fault group Gi. The fault candidate extracting unit 109 outputs fault candidate data CAN indicating the extracted equivalent fault groups Gi, to the judgment unit 111.

The judgment unit 111 decides a target node, which is a node into which an observation point is to be inserted, from multiple equivalent fault nodes, on the basis of the fault candidate data CAN and the inter-cell distance data DIS. Specifically, the failure analyticity evaluating unit 119 of the judgment unit 111 calculates a parameter M defined by an equation 1.

[Equation 1]

$$M = \sum_{i=1}^{N} J_i \cdot P_i \quad (1)$$

The parameter Pi in the equation 1 represents a probability (hereinafter referred to as "fault probability") that a single stuck-at fault is included in the equivalent fault group Gi when the single stuck-at fault occurs. The probability of fault occurrence is high in a circuit region where the distance between cells is large, because a node connecting between the cells is also long. Therefore, the fault probability Pi that the single stuck-at fault is included in the equivalent fault group Gi can be estimated by an equation 2, for example.

[Equation 2]

$$P_i = \frac{\sum_{j=1}^{J_i} L_{ij}/2}{L_{all}} \quad (2)$$

Lall in the equation 2 is a total sum of the lengths of all the nodes included in all the equivalent fault groups Gi (i=1, 2, . . . , and I) or in the entire circuit. In addition, Lij (j=1, 2, . . . , and Ji) represents the interconnection lengths of the equivalent fault nodes Nij included in the equivalent fault group Gi. Here, the failure analyticity evaluating unit 119 can estimate the interconnection lengths Lij by referring to the inter-cell distance data DIS.

With reference to the equation 1, the parameter M is a sum of the parameters Ji·Pi for all the equivalent fault groups Gi (i=1, 2, . . . , and I). In other words, the parameter M represents an average value of the number of equivalent fault nodes in a case where a single stuck-at fault has occurred at any position in the circuit. In order to facilitate a failure analysis, the parameter M, which is the average value of the number of equivalent fault nodes of when a fault occurs, should be reduced. Thus, the parameter M is referred to as failure analysis difficulty. In order to reduce the failure analysis difficulty M and enhance the failure analyticity, observation points should be inserted into suitable positions in the circuit.

The insertion position deciding unit 121 decides an observation point insertion position (i.e., a target node) at which the failure analysis difficulty M decreases. For example, the insertion position deciding unit 121 decides the target node at which the parameter M decreases most significantly.

The equivalent fault group Gi having the largest number of equivalent fault nodes Ji results in a large value for Ji·Pi, and therefore considerably contributes to a value of the parameter M. Thus, the parameter M can be significantly reduced by selecting target nodes from the equivalent fault nodes Nij (j=1, 2, . . . , and Ji) included in the equivalent fault group Gi. The failure analysis difficulty M can be efficiently reduced with a fewer observation points by preferentially inserting observation points into an equivalent fault group whose number of equivalent fault nodes is large.

In contrast, the failure analysis difficulty M can also be reduced efficiently by inserting observation points into the equivalent fault group Gi which has the largest product Ji·Pi of the number of equivalent fault nodes Ji and the fault probability Pi.

The judgment unit 111 decides target nodes into which observation points are to be inserted, as described above, and generates observation point insertion position data PNT indicating the decided target nodes. The observation point inserting unit 113 refers to the netlist NET and the observation point insertion position data PNT, and inserts at least one observation point into the target node. The observation point inserting unit 113 updates the netlist NET as the observation point is inserted.

The circuit design system repeats the above mentioned processes, as necessary. When the insertion process for the required observation points is finished, the circuit routing unit 115 reads out the netlist NET and the placement data ARR from the storage unit 103. The circuit routing unit 115 performs interconnection routing on the basis of the netlist NET and the placement data ARR, generates layout data LAY indicating a layout of a target circuit to be designed, and outputs the layout data LAY to the output unit 117. The output unit 117 outputs the layout data LAY.

With the circuit design system described in Patent Document 1, target nodes are decided based on the number of equivalent fault nodes Ji. For example, it is likely that the probability that a fault occurs in the equivalent fault group Gi having the largest number of equivalent fault nodes Ji is highest in all of the equivalent fault groups. Hence, the target nodes are selected from the equivalent fault group Gi having the largest number of equivalent fault nodes Ji, and observation points are preferentially inserted into the target nodes. Accordingly, an average value (failure analysis difficulty M) of the number of equivalent fault nodes in a case where a single stuck-at fault has occurred at any position in the circuit is reduced efficiently by inserting a fewer observation points.

SUMMARY

The following analysis will be given by the present invention. In addition, what is described in each of the above documents shall be incorporated herein by reference.

As described above, in the circuit design system described in Patent Document 1, elements having observation point functions need to be added to improve failure analyticity. This might lead to an increase in a chip area.

A logic circuit in an ASIC is structured by small logic circuit elements (cells) being bedded on a semiconductor chip. If a cell or a node connecting the cells overlaps with an observation point added later, then the cell or node needs to be displaced. In particular, when the density of the cells or the nodes is high, a major correction is needed to insert an observation point. Thus, in the circuit design system described in Patent Document 1, a large number of man-hours are needed to insert observation points, which may lead to higher cost of the failure analysis.

A circuit design device according to a first exemplary aspect of the present invention includes:

an equivalent fault class extracting unit for extracting one or more equivalent fault classes each of which is a class having, as members, equivalent fault interconnections that are interconnections mutually causing an equivalent fault in the circuit;

a weighting unit for giving a greater weight to the equivalent fault class or the equivalent fault interconnections included in the equivalent fault class, as the number of the equivalent fault interconnections that is the number of the members in the equivalent fault class increases; and a placement deciding unit for deciding placement of the elements and the interconnections so that, among the equivalent fault classes, an equivalent fault class having a larger number of equivalent fault interconnections would have a lower fault probability (hereinafter referred to as "fault probability") of including a single stuck-at fault.

A circuit design device according to a second exemplary aspect of the present invention includes:

an equivalent fault class extracting unit for extracting one or more equivalent fault classes each of which is a class having, as members, equivalent fault interconnections that are interconnections mutually causing an equivalent fault in the circuit;

a fault probability calculating unit for calculating a fault probability which is a probability that the equivalent fault class includes a single stuck-at fault;

an equivalent fault class selecting unit for selecting one or more of the equivalent fault classes having a relatively large number of equivalent fault interconnections and a relatively high fault probability, the number of equivalent fault interconnections being the number of the members included in the equivalent fault class; and a placement deciding unit for deciding placement of the elements and the interconnections so as to decrease the fault probability of the selected equivalent fault class.

With the circuit design device according to the exemplary aspects of the present invention, it is possible to facilitate a failure analysis while avoiding an increase in a chip area, in circuit designing. This is because the circuit design device of the present invention can lower the failure analysis difficulty without inserting an observation point.

BRIEF DESCRIPTION OF THE DRAWINGS

The above and other exemplary aspects, advantages and features of the present invention will be more apparent from the following description of certain exemplary embodiments taken in conjunction with the accompanying drawings, in which:

FIG. 7 is a table showing the number of elements and the number of nodes of a benchmark circuit in a fourth exemplary embodiment of the present invention; and FIGS. 8A and 8B show graphs indicating benchmark results on the circuit design device according to the fourth exemplary embodiment of the present invention.

DETAILED DESCRIPTION OF THE EXEMPLARY EMBODIMENTS

Exemplary Embodiment 1

Figure 1:
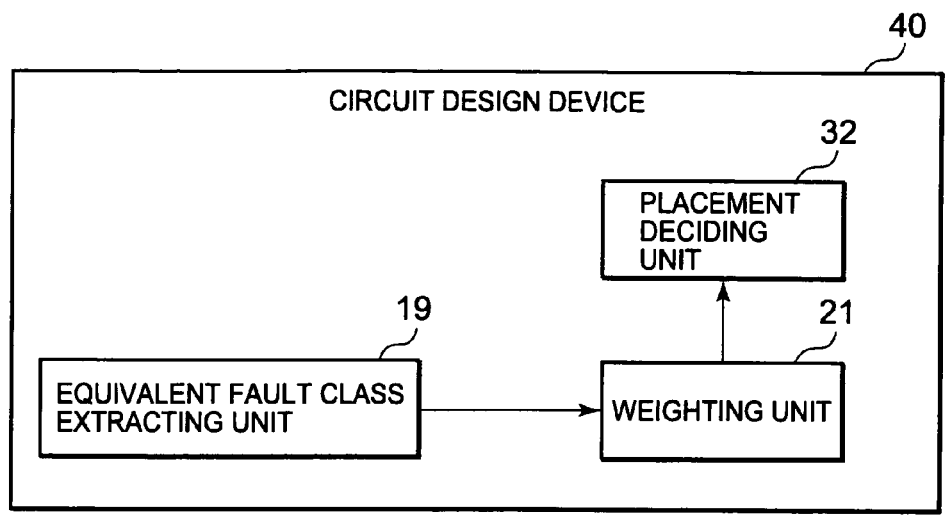
FIG. 1 is a block diagram showing a configuration of a circuit design device according to a first exemplary embodiment of the present invention.

A circuit design device according to a first exemplary embodiment of the present invention will be described with reference to the drawings. The circuit design device according to the first exemplary embodiment decides the placement of elements and interconnections included in a circuit, on the basis of connection information of the circuit. With reference to FIG. 1, a circuit design device 40 includes an equivalent fault class extracting unit 19, a weighting unit 21, and a placement deciding unit 32.

The equivalent fault class extracting unit 19 extracts one or more equivalent fault classes each of which is a class having, as members, equivalent fault interconnections that are interconnections mutually causing an equivalent fault in the circuit. The weighting unit 21 gives a greater weight to the equivalent fault class or the equivalent fault interconnections included in the equivalent fault class, as the number of the equivalent fault interconnections that is the number of the members in the equivalent fault class increases. The placement deciding unit 32 decides placement of the elements and the interconnections so that, among the equivalent fault classes, an equivalent fault class having a larger number of equivalent fault interconnections would have a lower fault probability that is a probability of including a single stuck-at fault.

The placement deciding unit 32 preferably decides placement of the elements and the interconnections so as to preferentially shorten the lengths of the equivalent fault interconnections included in the equivalent fault classes in descending order of the given weight.

The placement deciding unit 32 preferably decides placement of the elements and the interconnections so as to preferentially shorten the lengths of the equivalent fault interconnections in descending order of the given weight.

Preferably, the weight is proportional to the number of equivalent fault interconnections of each of the equivalent fault classes.

Preferably, the placement deciding unit 32 preferentially decides placement of the equivalent fault interconnections included in the equivalent fault classes in descending order of the given weight.

Preferably, the placement deciding unit 32 decides placement of the equivalent fault interconnections included in one or more of the equivalent fault classes given a smaller weight, or some of the equivalent fault interconnections given a smaller weight, so that density of the elements and the interconnections would be uniform, and then the placement deciding unit decides placement of the equivalent fault interconnections included in one or more of the equivalent fault classes given a greater weight or some of the equivalent fault interconnections given a greater weight.

In a case where an element needs to be displaced to satisfy a request for alleviating the density of the elements and/or the interconnections, inserting a buffer, changing the driving size of an element, optimizing timing or any other request, and where the displacement of the element increases the fault probability of an equivalent fault class or equivalent fault interconnections given a relatively great weight, it is preferably that the placement deciding unit 32, without displacing the element, satisfy the request by displacing another element, or searches for another destination to displace the element.

The weighting unit 21 preferably decides the weight on the basis of a COP (Controllability Observability Procedure), 1-controllability (a numeric value equal to or greater than 0 and equal to or less than 1. For details, see a second exemplary embodiment), a CRF (Cost Reduction Factor), or EFC (Expected Fault Coverage), or a value obtained by converting a weighted product or a weighted total sum of a combination thereof and the number of equivalent fault interconnections, the 1-controllability, the CRF, and the EFC being included as parameters constituting the COP.

Exemplary Embodiment 2

Figure 2:
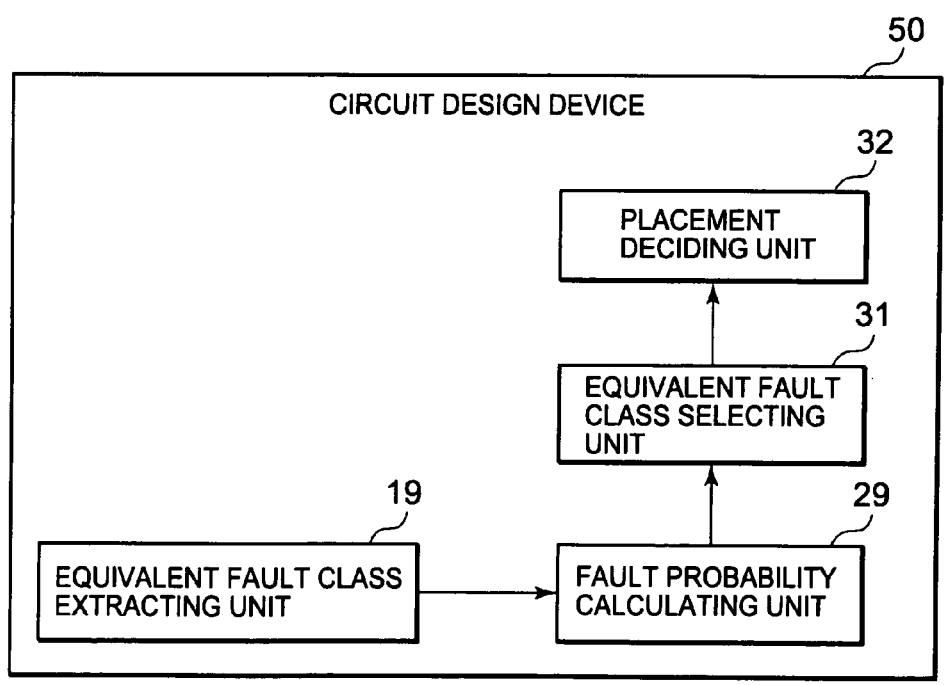
FIG. 2 is a block diagram showing a configuration of a circuit design device according to a second exemplary embodiment of the present invention.

A circuit design device according to a second exemplary embodiment of the present invention will be described with reference to FIG. 2. The circuit design device of the second exemplary embodiment decides placement of elements and interconnections included in a circuit, on the basis of connection information of the circuit. With reference to FIG. 2, a circuit design device 50 includes an equivalent fault class extracting unit 19, a fault probability calculating unit 20, an equivalent fault class selecting unit 31, and a placement deciding unit 32.

The equivalent fault class extracting unit 19 extracts one or more equivalent fault classes each of which is a class having, as members, equivalent fault interconnections that are interconnections mutually causing an equivalent fault in the circuit. The fault probability calculating unit 29 calculates a fault probability which is a probability that the equivalent fault class includes a single stuck-at fault. The equivalent fault class selecting unit 31 selects one or more of the equivalent fault classes having a relatively large number of equivalent fault interconnections and a relatively high fault probability, the number of equivalent fault interconnections being the number of the members included in the equivalent fault class. The placement deciding unit 32 decides placement of the elements and the interconnections so as to decrease the fault probability of the selected equivalent fault class.

The fault probability calculating unit 29 preferably calculates the fault probability on the basis of the lengths of the equivalent fault interconnections included in the equivalent fault class.

The placement deciding unit 32 preferably decides placement of the elements and the interconnections so as to shorten the lengths of the equivalent fault interconnections included in the equivalent fault class selected by the equivalent fault class selecting unit.

The fault probability calculating unit 29 preferably calculates the fault probability for each fault probability class on the basis of a total sum of the lengths of the equivalent fault interconnections included in the equivalent fault group.

The placement deciding unit 32 preferably decides placement of the elements and the interconnections so as to reduce a total sum of the lengths of the equivalent fault interconnections included in the equivalent fault class selected by the equivalent fault class selecting unit 31.

The fault probability calculating unit 29 preferably calculates the fault probability for each equivalent fault class on the basis of a space between the equivalent fault interconnections adjacent to each other in the equivalent fault class, a distance by which the adjacent interconnections extend in parallel, or density of interconnections in the neighborhood of the equivalent fault interconnections included in the equivalent fault group.

The placement deciding unit 32 preferably decides placement of the elements and the interconnections so as to: widen a space between the equivalent fault interconnections adjacent to each other in the equivalent fault class selected by the equivalent fault class selecting unit 31; shorten a distance by which the adjacent equivalent fault interconnections extend in parallel; or reduce density of interconnections in the neighborhood of the equivalent fault interconnections included in each equivalent fault class.

The circuit design device 50 preferably includes a hot spot evaluating unit for extracting hot spots having a high defective probability, on the basis of placement of the elements and the interconnections, the defective probability being a probability of becoming defective when a process variation is considered. The fault probability calculating unit 29 preferably calculates the fault probability for each equivalent fault class on the basis of information on the hot spots.

The circuit design device preferably includes a hot spot evaluating unit for extracting hot spots having a high defective probability, on the basis of placement of the elements and the interconnections. The placement deciding unit 32 preferably decides placement of the elements and the interconnections so as to remove one or more of the extracted hot spots included in the equivalent fault class selected by the equivalent fault class 31.

The fault probability calculating unit 29 preferably calculates the fault probability for each equivalent fault class so that the fault probability would be proportional or inversely proportional to: a distance between both ends of the equivalent fault interconnections included in the equivalent fault class; the total sum of the lengths of the equivalent fault interconnections included in the equivalent fault class; the space between the equivalent fault interconnections adjacent to each other in the equivalent fault class; the distance by which the adjacent equivalent fault interconnections extend in parallel; the density of interconnections in the neighborhood of the equivalent fault interconnections included in the equivalent fault class; a total number of the hot spots included in the equivalent fault class; a total sum of the defective probabilities in the equivalent fault class; or a combination thereof.

The fault probability calculating unit 29 preferably calculates the fault probability for each equivalent fault class so that the fault probability would be proportional to a weighted product or a weighted total sum of: the distance between both ends of the equivalent fault interconnections included in the equivalent fault class; the total sum of the lengths of the equivalent fault interconnections included in the equivalent fault class; the space between the equivalent fault interconnections adjacent to each other included in the equivalent fault class; the distance by the adjacent interconnections extend in parallel; the density of interconnections in the neighborhood of the equivalent fault interconnections included in the equivalent fault class; the total number of the hot spots included in the equivalent fault class; or the total sum of the defective probabilities in the equivalent fault class.

The equivalent fault class selecting unit 31 preferably extracts the equivalent fault classes in descending order of a product of the fault probability and the number of equivalent fault interconnections.

The equivalent fault class selecting unit 31 preferably extracts the equivalent fault classes in descending order of a weighted product or weighted total sum of the fault probability and the number of equivalent faults.

The circuit design device 50 preferably includes a timing analyzer for extracting an interconnection having a small operation margin against delay time. The placement deciding unit 32 preferably decides placement of the elements and the interconnections while excluding the interconnection extracted by the timing analyzer.

The equivalent fault class selecting unit 31 preferably selects an equivalent fault class on the basis of a COP, 1-controllability, a CRF, an EFC, or a value obtained by converting a weighted product or a weighted total sum of a combination thereof and the number of equivalent fault interconnections, the 1-controllability, the CRF, and the EFC being included as parameters constituting the COP.

In the first and second exemplary embodiments, the placement deciding unit 32 preferably decides placement of the elements and the interconnections for an equivalent fault class, of the equivalent fault classes, having a certain number of equivalent faults, the certain number being within a predetermined range.

In the first or second exemplary embodiment, the number of equivalent fault classes whose placement is to be decided, the number of elements whose placement is to be decided, a method of calculating the fault probability, a method of calculating the weight, or a value of a parameter included in a calculation equation of the fault probability or the weight is preferably specified from the outside of the circuit design device 40 or 50.

Exemplary Embodiment 3

Figure 3:
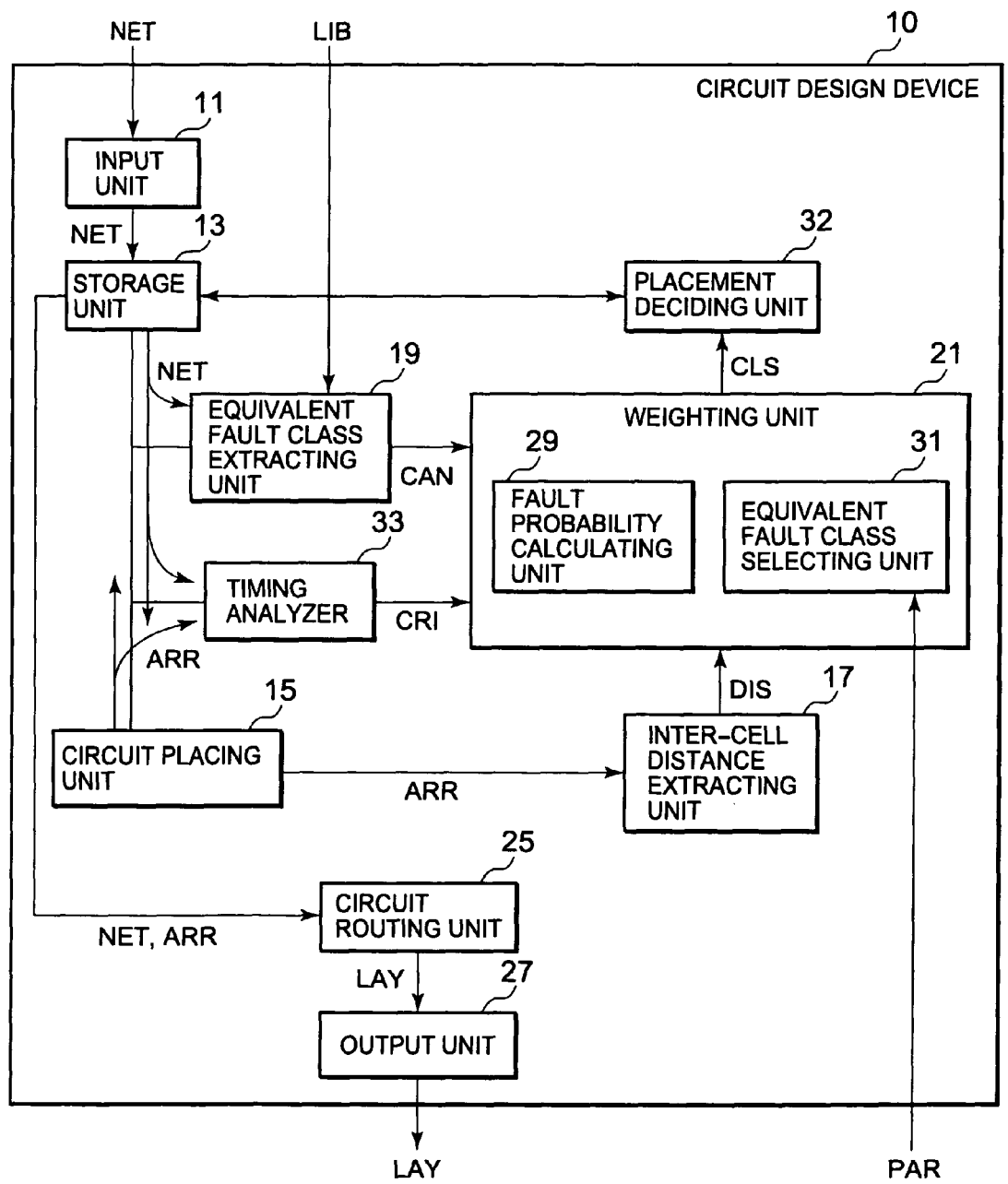
FIG. 3 is a block diagram showing a configuration of a circuit design device according to a third exemplary embodiment of the present invention.

FIG. 3 is a block diagram showing a configuration of a circuit design device of a third exemplary embodiment. With reference to FIG. 3, a circuit design device 10 includes an equivalent fault class selecting unit 31 and a placement deciding unit 32. In addition, similar to the circuit design system illustrated in FIG. 3 of Patent Document 1, the circuit design device 10 includes a circuit placing unit 15, an equivalent fault class extracting unit 19 (corresponding to the fault candidate extracting unit 109 of Patent Document 1), an inter-cell distance extracting unit 17, a fault probability calculating unit 29 (corresponding to the failure analyticity evaluating unit 119 of Patent Document 1), a circuit routing unit 25, an input unit 11, a storage unit 13, and an output unit 27. Alternatively, the circuit design device 10 may include a timing analyzer 33.

The operation of the circuit design device 10 according to the third exemplary embodiment will be described. With reference to FIG. 3, the circuit placing unit 15 refers to a netlist NET stored in the storage unit 13, and places circuit elements (cells). The circuit placing unit 15 not only stores a placement result of the circuit elements in the storage unit 13, but also outputs it to the inter-cell distance extracting unit 17. The inter-cell distance extracting unit 17 calculates inter-cell distance data DIS. Meanwhile, the equivalent fault class extracting unit 19 refers to the netlist NET, extracts equivalent fault groups, and generates equivalent fault group data CAN. The fault probability calculating unit 29 refers to the inter-cell distance data DIS and the equivalent fault group data CAN, and calculates failure analysis difficulty M defined by the equation 1. In addition, the equivalent fault class selecting unit 31 extracts a circuit region having a large product of the number of equivalent fault nodes and the fault probability, similarly to the insertion position deciding unit 121 of the circuit design system illustrated in FIG. 3 of Patent Document 1. The operation of the circuit design device 10 described above is similar to the operation of the circuit design system of Patent Document 1.

Next, the placement deciding unit 32 reduces the fault probability in the circuit region extracted above, by changing the cell placement. Given that the fault probability is proportional to the lengths of interconnections, it is possible to reduce the fault probability by changing the cell placement so that the inter-cell distance would be short. Then, since the failure analysis difficulty M decreases, a failure analysis is facilitated. Here, the circuit region in which the cell placement is changed is a circuit region that has a large number of equivalent fault nodes and a high fault probability. Thus, the failure analysis difficulty M can be efficiently reduced by decreasing the fault probability through the cell placement change. This operation by the placement deciding unit 32 differs from the operation of inserting an observation point into a circuit in the circuit design system of Patent Document 1.

After the placement deciding unit 32 has changed the cell placement with the procedure described above, the circuit routing unit 25 generates layout data LAY by performing routing. By manufacturing a photo mask and a chip of an integrated circuit on the basis of the layout data LAY, a failure analysis of the integrated circuit can be facilitated without inserting an observation point into the circuit.

Exemplary Embodiment 4

A circuit design device of a fourth exemplary embodiment of the present invention will be described with reference to FIG. 5. When a circuit region in which the cell placement is to be changed is decided, hot spots may be removed by using a hot spot evaluation result so as to facilitate a failure analysis. Hot spot is a term for DFM (Design For Manufacture) and refers to a shape which is likely to be a defective when process variations are considered. Here, the hot spot shall include a part which simply has a high fault probability, such as a part of a single via (not double via).

Figure 5:
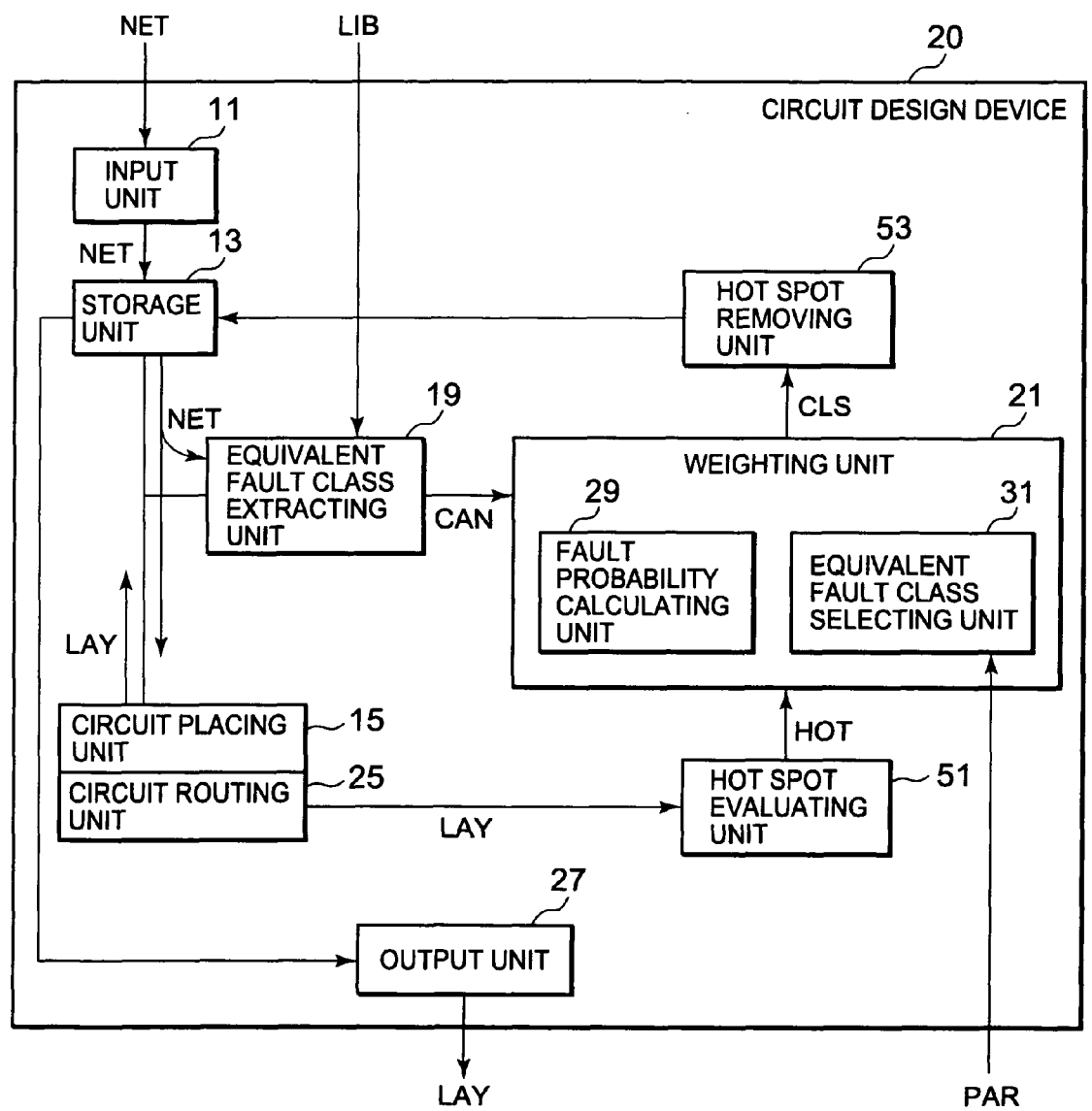
FIG. 5 is a block diagram showing a configuration of a circuit design device according to a fourth exemplary embodiment of the present invention.

FIG. 5 is a block diagram showing a configuration of a circuit design device of the fourth exemplary embodiment. With reference to FIG. 5, a circuit design device 20 includes a hot spot evaluating unit 51 instead of the inter-cell distance extracting unit 17 (FIG. 3), and includes a hot spot removing unit 53 instead of the placement deciding unit 32.

The operation of the circuit design device 20 according to the fourth exemplary embodiment will be described. First, the hot spot evaluating unit 51 extracts a hot spot in a layout in which the placement process and the routing have been completed. In addition, similar to the circuit design system described in Patent Document 1, the equivalent fault class extracting unit 19 performs extraction of equivalent fault groups. The fault probability calculating unit 29 calculates a fault probability of each equivalent fault group on the basis of a hot spot extraction result HOT.

Since a hot spot has a shape which is likely to cause a problem, an equivalent fault group having a large number of hot spots has a high fault probability. The equivalent fault class selecting unit 31 extracts a circuit region which has a large number of equivalent fault nodes and a high fault probability. The hot spot removing unit 51 removes hot spots in the extracted circuit region.

In addition, the hot spot removal also includes hot spot removal involving an increase in the chip area, such as formation of double vias. Thus, if a free area in a circuit is little, then there may be a case where not all the hot spots can be removed.

The circuit design device 20 preferentially performs the hot spot removal on a circuit region in descending order of the number of equivalent fault nodes and the fault probability. Therefore, the failure analysis difficulty M can be reduced efficiently even if all the hot spots cannot be removed. Then, it becomes possible to facilitate a failure analysis, compared with a case where hot spots are removed by simply considering a manufacturing yield only.

Exemplary Embodiment 5

A circuit design device of a fifth exemplary embodiment of the present invention will be described with reference to FIG. 6. When initial placement of cells is performed by the circuit placing unit 15, a process of reducing a fault probability of an equivalent fault group having a large number of faults may be carried out in parallel.

Figure 6:
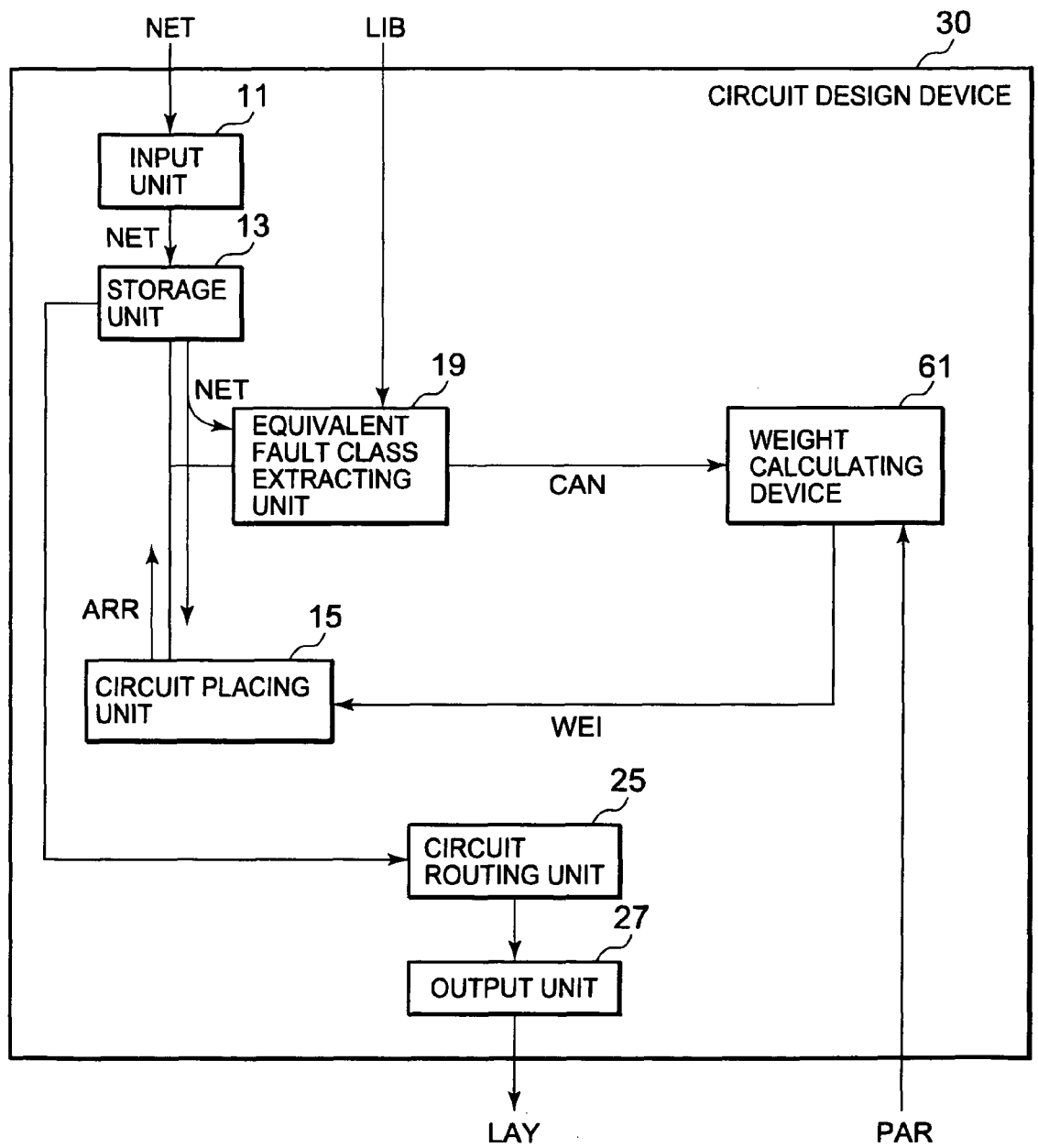
FIG. 6 is a block diagram showing a configuration of a circuit design device according to a fifth exemplary embodiment of the present invention.

FIG. 6 is a block diagram showing a configuration of a circuit design device 30 of the fifth exemplary embodiment. With reference to FIG. 6, the circuit design device 30 includes a weight calculating unit 61, instead of the fault probability calculating unit 29, the equivalent fault class selecting unit 31, the inter-cell distance extracting unit 17, and the placement deciding unit 32 in the circuit design device 10 of the third exemplary embodiment.

The operation of the circuit design device 30 of the fifth exemplary embodiment will be described. An equivalent fault class extracting unit 19 refers to a netlist NET, extracts equivalent fault groups, and generates equivalent fault group data CAN. The weight calculating unit 61 gives each node a weight corresponding to the number of equivalent fault nodes, and outputs a weight calculation result WEI to a circuit placing unit 15. Referring to the weight calculation result WEI, the circuit placing unit 15 performs the cell placement so that the interconnection length of a node having a greater weight would be shorter.

With the circuit design device 30, there is no need to make a change on the cell placement for failure analyticity after the placement process, which results in no design change. Thus, with the circuit design device 30, the number of design man-hour for making a failure analysis design can be saved.

As mentioned in the related art, when a fault part includes many equivalent faults, a true fault part cannot be identified through a fault diagnosis, and substantial cost is needed to identify the true fault part. On the one hand, if a fault probability in a circuit region having many equivalent faults is low, then the accuracy of narrowing down the equivalent faults by the diagnosis will improve and a failure analysis will be facilitated. Hence, with the circuit design device 30 according to this exemplary embodiment, a failure analysis or a fault diagnosis can be facilitated by performing the placement and routing in such a way that the fault probability in the fault probability group including many equivalent faults would decrease.

First Example 1

FIG. 3 is a block diagram showing a configuration of the circuit design device according to a first example of the present invention. With reference to FIG. 3, differences from the circuit design system illustrated in FIG. 3 of Patent Document 1 are as follows. Specifically, the insertion position deciding unit 121 in the judgment unit 111 of the circuit design system illustrated in FIG. 3 of Patent Document 1 is changed to the equivalent fault class selecting unit 31, and the observation point inserting unit 113 is changed to the placement deciding unit 32. Alternatively, in the first example, the circuit design device may include the timing analyzer 33.

The operation of the circuit design device of the first example will be described. First, the storage unit 13 stores a netlist NET inputted by way of the input unit 11. The circuit placing unit 15 places cell groups on the basis of the netlist NET. The circuit placing unit 15 stores cell placement data ARR showing a placement result in the storage unit 13, and outputs it to the inter-cell distance extracting unit 17. The inter-cell distance extracting unit 17 extracts and calculates information on an inter-cell distance on the basis of the cell placement data ARR. The inter-cell distance extracting unit 17 outputs inter-cell distance data DIS indicating the obtained inter-cell distance, to the weighting unit 21.

Meanwhile, the equivalent fault class extracting unit 19 refers to the netlist NET, extracts equivalent fault groups, and outputs fault candidate data CAN indicating the extracted equivalent fault groups, to the weighting unit 21. The fault probability calculating unit 29 of the weighting unit 21 calculates failure analysis difficulty M defined by the equation 1, on the basis of the inter-cell distance data DIS and the fault candidate data CAN. In addition, similar to the insertion position deciding unit 121 in the circuit design system described in Patent Document 1, the equivalent fault class selecting unit 31 selects an equivalent fault group Gi having a large product of the number Ji of equivalent fault nodes and the fault probability Pi, and outputs information CLS on the selected equivalent fault group Gi to the placement deciding unit 32. The operation of the circuit design device 10 described above is similar to the operation of the circuit design system illustrated in FIG. 3 of Patent Document 1.

In order to extract the equivalent fault groups, the equivalent fault class extracting unit 19 needs circuit element operation information LIB indicating a relation of an input logic and an output logic of each circuit element (cell). In the block diagram of the circuit design system illustrated in FIG. 4 of Patent Document 1, the circuit element operation information LIB is not illustrated explicitly. However, the circuit element operation information LIB is explicitly shown in FIG. 3 herein because it is obviously necessary in extracting the equivalent fault groups.

The placement deciding unit 32 changes the cell placement so that the fault probability of the equivalent fault group Gi specified in the equivalent fault group information CLS would decrease. Additionally, the placement deciding unit 32 updates the placement information ARR stored in the storage unit 13. Given that the fault probability Pi of the equivalent fault group Gi is proportional to a total interconnection length of fault nodes included in G1, like the equation 2, the fault probability Pi can be reduced by shortening the lengths of the interconnections through such a change in the cell placement that the distance between cells included in G1 would be short. By reducing the fault probability Pi, the failure analysis difficulty M also decreases, thus facilitating a failure analysis.

A circuit region specified in the equivalent fault group information CLS is the equivalent fault group in which a product of the number Ji of equivalent fault nodes and the fault probability Pi takes a large value. Thus, by reducing the fault probability Pi in that circuit region, the placement of only a few cells can efficiently reduce the failure analysis difficulty M. Such an operation makes the circuit design device 10 of the first example differ from the circuit design system described in Patent Document 1 which inserts an observation point into a circuit.

After repeating the above process, as necessary, the circuit routing unit 25 reads out the netlist NET and the placement data ARR from the storage unit 13. The circuit routing unit 25 performs routing on the basis of the netlist NET and the placement data ARR, and creates layout data LAY indicating a layout of a target circuit to be designed. The circuit routing unit 25 outputs the layout data LAY to the output unit 27. The output unit 27 outputs the layout data LAY to the outside of the circuit design device 10. The user of the circuit design device 10 can manufacture masks or LSI chips on the basis of the outputted layout data LAY.

With the circuit design device 10 of the actual example, only by changing the circuit placement and nodes, a failure analysis can be facilitated without inserting an observation point. Thus, the circuit design device can minimize an increase in a chip area needed in making a failure analysis facilitating design.

Incidentally, when a placement change process is performed, a delay time needed for a signal to propagate between circuit elements will change. Therefore, in the case of a synchronous circuit, the circuit may not operate in the original clock cycle. Accordingly, it is preferable to include the circuit design device 10 and furthermore the timing analyzer 33.

The timing analyzer 33 extracts a circuit region with a small operation margin against a change in the delay time (i.e., critical path). The timing analyzer 33 performs a timing analysis on the basis of the netlist NET and the placement data ARR, extracts region information CRI on the critical path, and outputs it to the weighing unit 21. The weighting unit 21 refers to CRI and excludes the critical path from the target for a circuit placement change or an interconnection change.

Even in a case where the cell placement is changed with the critical path excluded, the circuit may not operate in the original clock cycle if the number of parts to be changed increases. Hence, in the circuit design device 10, it is preferable that a parameter PAR for adjusting the number of repetitions of the above process can be inputted from the outside.

For an algorithm of selecting an equivalent fault group to go through a placement change, various methods, such as giving priority to an equivalent fault group with a high fault probability Pi, can be used, in addition to the method of simply giving priority to an equivalent fault group with a large product of Ji and Pi. For example, instead of the product of Ji and Pi, a weighted product defined by an equation 3 or a weighted total sum defined by an equation 4 may be used. If the equation 4 is used, then the degree of influence of Pi can be increased by increasing L2 relative to a weight L1.

[Equation 3]

$$D_i = J_i^{L1} \cdot P_i^{L2} \quad (3)$$

[Equation 4]

$$D_i = L1 \cdot J_i + L2 P_i \quad (4)$$

In addition, by using a discontinuous function like an equation 5, the number Ji of equivalent fault nodes is converted into Jci which is then substituted into Ji of the equation 3 or the equation 4. When the equation 5 is used, the equivalent fault group having the number of faults in a range not less than L7 but less than L8 is preferentially subjected to a reduction of the fault probability through a placement change, or excluded from the target for the placement change.

[Equation 5]

$$J_{ci} = \begin{cases} L_1 \cdot J_i^{L2} & (J_i < L_7) \\ L_3 \cdot J_i^{L4} & (L_7 \le J_i < L_s) \\ L_5 \cdot J_i^{L6} & (L_8 \le J_i) \end{cases} \quad (5)$$

When an exponent function of an equation 6 is used instead of the equation 5, a similar effect to the case of using the equation 5 can be obtained. When the equation 6 is used, a placement change is performs preferentially for an equivalent fault group whose number of faults is close to L2.

[Equation 6]

$$J_{ci} = L_1 \cdot \exp(-(J_i - L_2)2) \quad (6)$$

Here, L1 to L8 are parameters for adjusting the algorithm to select an equivalent fault group to go through a placement change, and are any constants. It is preferable that the external parameter PAR not only switch the algorithm for selecting the equivalent fault group to go through the placement change, but also adjust the values of the parameters L1 to L8.

In this example, after the placement deciding unit 32 makes a placement change, the circuit routing unit 25 carries out routing. However, in reverse order to this, the circuit routing unit 25 may carry out routing after the circuit placing unit 15 completes the placement process, and then the placement deciding unit 32 may carry out the change process on a layout for which the placement and the routing are completed. In this case, when the fault probability Pi on each equivalent fault group is calculated, information on the actual interconnection length can be used instead of the inter-cell distance information DIS. As defined in the equation 2, when the fault probability is proportional to the interconnection length, the precision of calculation of the fault probability can be improved by using the actual interconnection length instead of the inter-cell distance information DIS.

In addition, the fault probability also depends on a space between interconnections. For example, when a space between adjacent interconnections is narrow or when a distance by which interconnections extend in parallel is long, a probability that a short fault occurs due to inclusion of foreign materials increases. If the above procedure is used, then information on the space between the adjacent interconnections or the distance of the interconnections extending in parallel can also be used to calculate the fault probability of each equivalent fault group. Accordingly, the accuracy of calculation of the fault probability can be further improved. It is also possible to reduce the fault probability by lowering a degree of congestion of interconnections in the neighborhood of interconnections included in the equivalent fault group decided as the target for a placement change or by widening the space between the adjacent interconnections. Therefore, variations in routing also increase.

Note that, when the placement deciding unit 32 displaces a circuit element, a node connected to the displaced circuit element needs to undergo the routing again, and it is necessary to take notice so that a collision with an existing interconnection would not occur in the re-interconnection.

Second Example

FIG. 4 is a block diagram showing a configuration of a circuit design device according to a second example. In this example, unlike the first example, the fault probability calculating unit 29 calculates a COP (Controllability Observability Procedure), which is a parameter to be used in evaluation of failure analyticity. Here, as described in Non-Patent Document 1, the COP includes 1-Controllability Ci, observability Oi, and an s stuck-at fault detection rate Pi/s. For example, the 1-Controllability Ci represents a probability that a node i has a theoretical value 1 when a random test vector is applied to a circuit. By performing appropriate conversion on the 1-Controllability Ci, Ci can be used as a substitute for the number Ji of equivalent fault nodes. This will be described hereinafter with reference to FIG. 4.

[Non-Patent Document 1] Suguru Shinomiya, and three others, "Evaluation of Diagnosability in Test Point Inserted Logic BIST Circuit", LSI Testing Symposium/2005, Fault Diagnosis Algorithm/System, Nov. 10, 2005

Figure 4A:
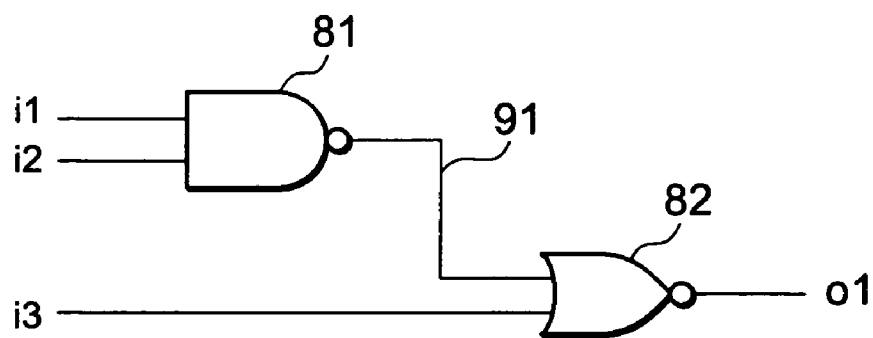
FIGS. 4A and 4B show diagrams illustrating a circuit which, as a while, serves as one equivalent fault class, and a circuit of any other type.

In a circuit of FIG. 4A, the whole circuit is one equivalent fault class. Specifically, in the circuit of FIG. 4A, an output is stuck at 0, regardless of whether a stuck-at −0 fault of an input of a NAND element 81 or a stuck-at −1 fault of an input of a NOR element 82 occurs. Thus, it is not possible to narrow down a fault part by a fault diagnosis at a logical level. In contrast, in a circuit of FIG. 4B, the whole circuit is not one equivalent fault class.

Assuming that an input test vector is I={i2, i3}, it is only when I={1, 1, 0} that a node of becomes 1 in the circuit of FIG. 4A where the whole circuit is one equivalent fault class. Since the number of input terminals is 3, the number of the input test vector I is $2^3=8$. Thus, the probability C1 that o1 becomes 1 is ⅛.

Figure 4B:
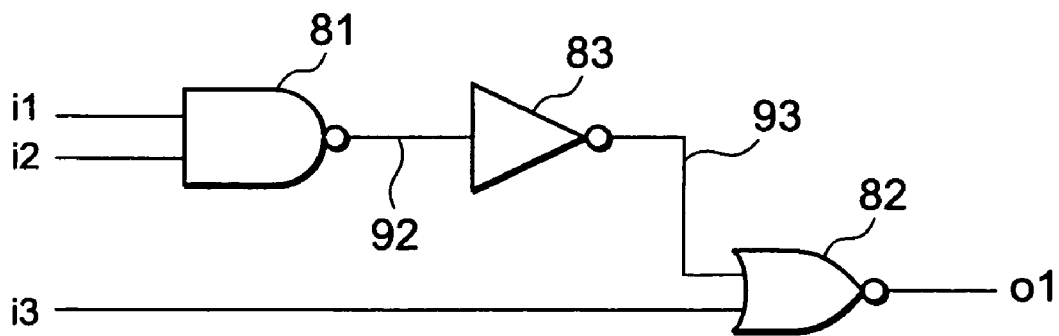

In contrast, in the circuit of FIG. 4B where the whole circuit is not one equivalent fault class, the node o1 becomes 1 in the following three cases: I={0, 0, 0}, I={1, 0, 0}, and I={0, 1, 0}. Thus, C1 is ⅜. In other words, the value of C1 is closer to 0 in the circuit of FIG. 4A where the whole circuit is one equivalent fault class.

For an equivalent fault class having a large number of elements, similarly, the 1-Controllability Ci has a value close to 0 or 1. In contrast, in a node not included in an equivalent fault class, Ci has a value close to 0.5. Thus, by converting Ci as in an equation 7, Ci can be used as an indicator representative of analysis difficulty, instead of the number Ji of equivalent fault nodes. Note that a coefficient α in the equation 7 is an arbitrary positive constant.

[Equation 7]

$$Ji=\alpha|Ci-0.5| \quad (7)$$

The observability Oi and s stuck-at fault detection rate Pi/s, which are parameters included in the COP other than Ci, are values that evaluate failure analyticity from a viewpoint different from Ci. Thus, each of these indicators can also be used as a substitute for the number Ji of equivalent fault nodes, by converting them as appropriate. In addition, a new failure analyticity evaluation parameter can be generated by an equation in which a combination of more than one parameter of any of the three parameters of the COP and the number Ji of equivalent fault nodes is used, and the parameter thus generated can be used as a substitute for the number Ji of equivalent fault nodes. Examples of such include a method of using a weighted product or a weighted total sum, as mentioned in the first exemplary embodiment. In addition, Non-Patent Document 1 describes a method of calculating a failure analyticity evaluation indicator such as a CRF (Cost Reduction Factor) or an EFC (Expected Fault Coverage), from the COP. The indicators can also be used instead of the number Ji of equivalent fault nodes.

Third Example

The circuit design device of a third example reduces the fault probability Pi by removing hot spots using a hot spot evaluation tool to be used in a DFM when the fault probability Pi is calculated. A hot spot represents a shape that is likely to be a defective when process variations are considered. Here, a hot spot includes a part which simply has a high fault probability, such as a part of a single via (not double via). In this example, the circuit design device efficiently reduces the failure analysis difficulty M by preferentially removing hot spots of an equivalent fault group Gi which has a large number Ji of equivalent fault nodes and many hot spots.

FIG. 5 is a block diagram showing a configuration of the circuit design device of the third example. When the block diagram of FIG. 5 is compared with the block diagram showing the configuration of the circuit design system illustrated in FIG. 4 of Patent Document 1, they are different in that the circuit routing unit 25 is provided immediately after the circuit placing unit 105. They are also different in that the hot spot evaluating unit 51 is provided instead of the inter-cell distance extracting unit 107. Furthermore, they are different in that the hot spot removing unit 53 is provided instead of the observation point inserting unit 113.

In the circuit design device 20, immediately after the circuit placing unit 15 performs a placement process on circuit elements, the circuit routing unit 25 carries out routing, and generates layout data LAY after completion of the routing. The circuit routing unit 25 not only stores the layout data LAY in the storage unit 13 but also outputs it to the hot spot evaluating unit 51. The hot spot evaluating unit 51 extracts hot spots existing in the layout data LAY. The hot spot evaluating unit 51 outputs a hot spot extraction result HOT to the weighting unit 21.

Similar to the first example, the equivalent fault class extracting unit 19 extracts equivalent fault groups, and outputs an extraction result CAN of the equivalent fault groups to the weighting unit 21. The fault probability calculating unit 29 of the weighting unit 21 evaluates the number Ji of equivalent fault nodes and the fault probability Pi in each equivalent fault group, and the equivalent fault class selecting unit 31 extracts an equivalent fault group whose product of Ji and Pi is large. The equivalent fault class selecting unit 31 outputs information CLS on the extracted equivalent fault group Gi to the hot spot removing unit 53.

The circuit design device 20 of the third example differs from the first example in that it refers to the hot spot extraction result HOT, when the fault probability calculating unit 29 calculates the fault probability Pi of each equivalent fault group. Since a hot spot is a part having a high fault probability, an equivalent fault group Gi having many hot spots also has a high failure probability. Thus, the fault probability Pi of each equivalent fault group Gi can be obtained based on the hot spot evaluation result. For example, the fault probability Pi of G1 can be obtained based on an equation 8, while assuming that Pi is proportional to the number Hi of hot spots included in G1. Here, β in the equation 8 is an arbitrary positive constant.

[Equation 8]

$$Pi=\beta \sim Hi \quad (8)$$

In addition, if a risk that a fault actually occurs can be evaluated by hot spots, then Pi can be obtained using an equation 9. Here, Rij of the equation 9 represents a risk that a fault occurs in each hot spot included in the equivalent fault group Gi. Since the fault probability of an equivalent fault group having many hot spots whose fault probabilities are high, is highest when the equation 9 is used. For this reason, it can be said that it is a more realistic model.

[Equation 9]

$$P_i = \beta \cdot \sum_{j=1}^{H_i} R_{ij} \quad (9)$$

In addition, as mentioned in the first example, other than Hi or Rij, information on an inter-cell distance or interconnection length may be used, and a weighted product or a weighted total sum thereof may be used as the fault probability Pi.

The hot spot removing unit 53 removes the hot spots included in the equivalent fault group Gi specified by CLS, by changing the layout data LAY stored in the storage unit 13. The hot spot removing unit 53 removes the hot spots by performing a process of widening an interconnection pitch on a narrow-pitch interconnection part which is susceptible to a bridging fault due to process variations. Alternatively, the hot spot removing unit 53 removes the hot spots by making a redundancy design using double vias (which refers to a technique of preventing an open fault due to a via by arranging side-by-side more than one via structure connecting between metal interconnection layers). Consequently, the fault probability of the equivalent fault group Gi specified in CLS is reduced.

In addition, similar to the first example, timing convergence may be prevented from collapsing by performing a timing analysis on the basis of the layout data LAY and the netlist NET, and thus by preventing a layout change from being performed on any interconnection or circuit element included in a critical path.

After the above processes are repeated, as necessary, the output unit 27 outputs the layout data LAY. The user of the circuit design device 20 can manufacture masks or LSI chips on the basis of the outputted layout data LAY.

With the circuit design device 20 following the above-described procedure, the hot spots are removed from the layout, thereby allowing the manufacturing of integrated circuit chips a failure analysis of which has been facilitated. Note that the spot removal includes cases of involving an increase in the chip area, such as formation of double vias. Hence, depending on the size of a free area, there might be cases in which not all of the hot spots can be removed. However, the circuit design device 20 preferentially performs removal of hot spots on the fault group Gi having a large number Ji of equivalent fault nodes and a high fault probability Pi. In other words, the circuit design device 20 preferentially removes hot spots which are highly effective in improving failure analyticity. Thus, the circuit design device 20 can efficiently reduce the failure analysis difficulty M even when it cannot remove all the hot spots. Accordingly, with the circuit design device 20, a failure analysis can be substantially facilitated, compared with the case where the hot spots are removed simply considering the manufacturing yield only.

Fourth Example

A circuit design device of a fourth example performs cell placement and analysis facilitation that is achieved by optimizing the placement, concurrently. FIG. 6 is a block showing a configuration of a circuit design device 30 of the fourth example. Compared with the circuit design system illustrated in FIG. 4 of Patent Document 1, the circuit design device 30 differs in that it includes the weight calculating unit 61, instead of the insertion position deciding unit 121, the inter-cell distance extracting unit 107, and the observation point inserting unit 113.

On the basis of the information CAN on equivalent fault groups, the weight calculating unit 61 calculates weights WEI and outputs them to the circuit placing unit 15. The operation of the circuit design device 30 will be described in detail in the following.

The storage unit 13 receives a netlist NET by way of the input unit 11 and records it therein. The equivalent fault class extracting unit 19 refers to the netlist NET, extracts equivalent fault groups, and outputs fault candidate data CAN indicating the extracted equivalent fault groups, to the weight calculating unit 61. The weight calculating unit 61 calculates a weight WEI corresponding to the number Ji of equivalent fault nodes included in each equivalent fault group, and sets the calculated weight WEI to each equivalent fault node included in the equivalent fault group.

When performing a placement process of elements included in the netlist NET, the circuit placing unit 15 refers to information on the weight WEI, and performs element placement so that a fault probability of a node having a greater weight would be smaller. When the fault probability is proportional to the interconnection length as shown in the equation 2, by performing cell placement so that the interconnection length of a node having a greater weight would be smaller, the fault probability of that node can be reduced.

Subsequent processes are similar to those of the circuit design system described in Patent Document 1. That is, the circuit routing unit 25 carries out routing, on the basis of an element placement result ARR, generates layout data LAY, and outputs it to the output unit 27. The output unit 27 outputs the layout data LAY to the outside of the circuit design device 30. The user of the circuit design device 30 can manufacture masks or LSI chips on the basis of the outputted layout data LAY.

In the layout data LAY obtained by the above procedure, the fault probability Pi for the equivalent fault group Gi having a large number Ji of equivalent fault nodes is small. Thus, with the circuit design device 30, since a value of the failure analysis difficulty M is also small, it is possible to obtain a layout a failure analysis of which is easier than the case where no weight WEI is set.

Compared with the circuit design device of the first example, the circuit design device 30 can save the number of design man-hours necessary for making a failure analysis facilitating design. This is because the making of the failure analysis facilitating design is completed at the time when the cell placement and the routing are completed, and therefore no design change occurs. If a circuit change for facilitating a failure analysis is made after the placement of circuit elements or the routing has been completed, then the delay of a circuit around the changed part might be changed and thus a delay violation accompanying this might occur. When a delay violation occurs, a design change to avoid it occurs, and the number of design man-hours for making a failure analysis facilitating design increases.

Note that, as a method of calculating the weight WEI, a method of setting a weight only for a fault group whose Ji is greater than a threshold may be used, in addition to the method of simply setting the number Ji of equivalent fault nodes as a weight parameter for each node. In addition, as mentioned in the second exemplary embodiment, a method of calculating a weight WEI by an equation using a COP and Ji may be used. Meanwhile, when an extremely heavy weight is set, timing may not converge easily in the cell placement or the routing. Hence, it is preferable to make it possible to control the method or the equation for calculating the weight WEI, by the external parameter PAR.

In addition, the circuit routing 25 may also refer to the weight WEI, and perform the routing on nodes included in the equivalent fault group Gi with a large number Ji of equivalent fault nodes so that the fault probability of the nodes would be small. As mentioned in the first example, if this method is used, the probability of short fault occurrence can be reduced by reducing a degree of congestion of interconnections in the neighborhood of interconnections included in an equivalent fault group Gi with a large number Ji of equivalent fault nodes, or by widening a distance between adjacent interconnections included in the equivalent fault group Gi. Accordingly, flexibility in the cell placement process by the circuit design device 30 is increased.

Alternatively, by, first, performing the placement and the routing of a circuit region having a great weight WEI, the fault probability of the circuit region may be reduced efficiently.

Meanwhile, after the element placement or the routing of a circuit region having a small weight WEI is, first, performed in discrete manner so that the degree of congestion of placement and routing on the whole surface of the chip would be constant, the placement and the routing of the circuit region having a large weight WEI may be carried out so that the fault probability of the region would be small, by utilizing regions, specifically, spaces where no elements nor interconnections are placed.

In addition, in a case where displacement of elements is necessary due to alleviation of the degree of congestion of elements or interconnections, insertion of a buffer, a change in drive size of an element, timing optimization, or the like at the time of cell placement and routing, the requests may be satisfied by displacing other elements rather than displacing the elements, if the fault probability of a circuit with a great WEI increases due to the displacement of the elements. Furthermore, a different destination of displacement may be explored so that the fault probability would be lower.

What is shown below is an evaluation result of a degree of improvement in the failure analyticity in a case where the circuit design device of the exemplary embodiment is actually constructed and the placement and the routing is performed on a small circuit. Here, a circuit 1 and a circuit 2 with the number of cells and the number of nodes shown in FIG. 7 served as evaluation targets, and the behavior of the analysis difficulty M with respect to the number of nodes to which a weight is added was examined. The weight was added to nodes in descending order of the number of equivalent fault nodes, and the value of the weight was set five times as high as a node to which no weight was added. In other words, placement and routing were performed so that the interconnection length of the node to which the weight was added would be ⅕ of the interconnection length of the node to which no weight was added.

FIGS. 8A and 8B show the evaluation result. With reference to FIG. 8, the number of weighted nodes necessary to reduce the analysis difficulty M by 10% is approximately 75 nodes (3% of all the nodes) in the circuit 1 and approximately 1000 nodes (5% of all the nodes) in the circuit 2. In other words, the analysis difficulty M can be reduced by approximately 10%, by adding the weight to the nodes of 3 to 5% of all the nodes. Hence, by designing an integrated circuit using the circuit design device 30, the analysis difficulty M of the circuit is reduced and a failure analysis can be facilitated.

INDUSTRIAL APPLICABILITY

The circuit design device according to the present invention can be used to improve the failure analyticity of a semiconductor integrated circuit, in particular, a CMOS logic circuit, and also can be applied to a logic circuit formed of a bipolar, an NMOS, a compound semiconductor element, or the like. In addition to semiconductor integrated circuits, the circuit design device according to the present invention can be used to improve the failure analyticity of a printed-interconnection board whose interconnection layers have been significantly multi-layered in recent years, and can be also be used to facilitate a failure analysis of an optical logic circuit using an optical switch element and any other logic circuit.

Further, it is noted that Applicant's intent is to encompass equivalents of all claim elements, even if amended later during prosecution.

What is claimed is:

1. A circuit design device for deciding and changing a placement of elements and interconnections included in a circuit, on a basis of connection information of the circuit, the circuit design device comprising:
    an equivalent fault class extracting unit for extracting one or more equivalent fault classes each of which comprises a class having, as members, equivalent fault interconnections that comprise interconnections mutually causing an equivalent fault in the circuit;
    a weighting unit for giving a greater weight to the equivalent fault class or the equivalent fault interconnections included in the equivalent fault class, as a number of the equivalent fault interconnections that is a number of the members in the equivalent fault class increases; and
    a placement deciding unit for decreasing a fault probability by changing the placement of the elements and the interconnections, the fault probability comprising a probability that a single stack-at fault is included in an equivalent fault class which has a larger number of equivalent fault interconnections.

2. The circuit design device according to claim 1, wherein the placement deciding unit shortens lengths of the equivalent fault interconnections included in the equivalent fault classes in descending order of the given weight when the placement of the elements and the interconnections is decided or changed.

3. The circuit design device according to claim 1, wherein the weight is proportional to the number of equivalent fault interconnections of each of the equivalent fault classes.

4. The circuit design device according to claim 1, wherein the placement deciding unit preferentially decides the placement of the equivalent fault interconnections included in the equivalent fault classes in descending order of the given weight.

5. The circuit design device according to claim 1, wherein the placement deciding unit decides the placement of the equivalent fault interconnections included in one or more of the equivalent fault classes given a smaller weight, or some of the equivalent fault interconnections given a smaller weight, so that density of the elements and the interconnections is uniform, and
    the placement deciding unit decides the placement of the equivalent fault interconnections included in one or more of the equivalent fault classes given a greater weight or some of the equivalent fault interconnections given a greater weight.

6. The circuit design device according to claim 1, wherein, in a case where an element needs to be displaced to satisfy a request for any of alleviating a density of the elements and/or the interconnections, inserting a buffer, changing a driving size of an element, or optimizing timing, and where a displacement of the element increases the fault probability of an equivalent fault class or equivalent fault interconnections given a relatively great weight, the placement deciding unit, without displacing the element, satisfies the request by displacing another element, or searches for another destination to displace the element.

7. The circuit design device according to claim 1, wherein the weighting unit decides the weight on a basis of a COP (Controllability Observability Procedure), 1-controllability, a CRF (Cost Reduction Factor), or EFC (Expected Fault Coverage), or a value obtained by converting a weighted product or a weighted total sum of a combination thereof and the number of equivalent fault interconnections, the 1-controllability, the CRF, and the EFC being included as parameters constituting the COP.

8. A circuit design device for deciding and changing a placement of elements and interconnections included in a circuit, on a basis of connection information of the circuit, the circuit design device comprising:
- an equivalent fault class extracting unit for extracting one or more equivalent fault classes each of which comprises a class having, as members, equivalent fault interconnections that comprise interconnections mutually causing an equivalent fault in the circuit;
- a fault probability calculating unit for calculating a fault probability which comprises a probability that a single stuck-at fault is included in an equivalent fault class has a of equivalent fault interconnections:
- an equivalent fault class selecting unit for selecting one or more of the equivalent fault classes having a relatively large number of equivalent fault interconnections and a relatively high fault probability, the number of equivalent fault interconnections being a number of the members included in the equivalent fault class; and
- a placement deciding unit for decreasing the fault probability by changing the placement of the elements and the interconnections.

9. The circuit design device according to claim 8, wherein the fault probability calculating unit calculates the fault probability on a basis of lengths of the equivalent fault interconnections included in the equivalent fault class.

10. The circuit design device according to claim 8, wherein the placement deciding unit shortens lengths of the equivalent fault interconnections included in the equivalent fault class selected by the equivalent fault class selecting when the placement of elements and interconnections is decided or changed.

11. The circuit design device according to claim 8, wherein the fault probability calculating unit calculates the fault probability for each fault probability class on a basis of a total sum of lengths of the equivalent fault interconnections included in the equivalent fault group.

12. The circuit design device according to claim 8 wherein the placement deciding unit decides the placement of the elements and the interconnections so as to reduce a total sum of lengths of the equivalent fault interconnections included in the equivalent fault class selected by the equivalent fault class selecting unit.

13. The circuit design device according to claim 8, wherein the fault probability calculating unit calculates the fault probability for each equivalent fault class on a basis of a space between the equivalent fault interconnections adjacent to each other in the equivalent fault class, a distance by which the adjacent interconnections extend in parallel, or density of interconnections in a neighborhood of the equivalent fault interconnections included in the equivalent fault group.

14. The circuit design device according to claim 8, wherein the placement deciding unit decides the placement of the elements and the interconnections so as to at least one of:
- widen a space between the equivalent fault interconnections adjacent to each other in the equivalent fault class selected by the equivalent fault class selecting unit;
- shorten a distance by which the adjacent equivalent fault interconnections extend in parallel; and
- reduce density of interconnections in a neighborhood of the equivalent fault interconnections included in each equivalent fault class.

15. The circuit design device according to claim 8, further comprising:
- a hot spot evaluating unit for extracting hot spots having a high defective probability, on a basis of placement of the elements and the interconnections, the high defective probability being a probability of becoming defective when a process variation is considered, wherein the fault probability calculating unit calculates the fault probability for each equivalent fault class on a basis of information on the hot spots.

16. The circuit design device according to claim 8, further comprising:
- a hot spot evaluating unit for extracting hot spots having a high defective probability, on a basis of placement of the elements and the interconnections, wherein the placement deciding unit decides the placement of the elements and the interconnections so as to remove one or more of the extracted hot spots included in the equivalent fault class selected by the equivalent fault class selecting unit.

17. The circuit design device according to claim 9, wherein the fault probability calculating unit calculates the fault probability for each equivalent fault class so that the fault probability would be proportional or inversely proportional to:
- a distance between both ends of the equivalent fault interconnections included in the equivalent fault class;
- a total sum of lengths of the equivalent fault interconnections included in the equivalent fault class;
- a space between equivalent fault interconnections adjacent to each other in the equivalent fault class;
- a distance by which the adjacent equivalent fault interconnections extend in parallel;
- a density of interconnections in a neighborhood of the equivalent fault interconnections included in the equivalent fault class;
- a total number of hot spots included in the equivalent fault class;
- a total sum of defective probabilities in the equivalent fault class; or
- a combination thereof.

18. The circuit design device according to claim 17, wherein the fault probability calculating unit calculates the fault probability for each equivalent fault class so that the fault probability is proportional to a weighted product or a weighted total sum of:
- the distance between both ends of the equivalent fault interconnections included in the equivalent fault class;
- the total sum of the lengths of the equivalent fault interconnections included in the equivalent fault class;
- the space between the equivalent fault interconnections adjacent to each other included in the equivalent fault class;
- the distance by which the adjacent interconnections extend in parallel;
- the density of interconnections in the neighborhood of the equivalent fault interconnections included in the equivalent fault class;
- the total number of the hot spots included in the equivalent fault class; or
- the total sum of the defective probabilities in the equivalent fault class.

19. The circuit design device according to claim 8, wherein the equivalent fault class selecting unit extracts the equivalent fault classes in descending order of a product of the fault probability and a number of equivalent fault interconnections.

20. The circuit design device according to claim 8, wherein the equivalent fault class selecting unit extracts the equivalent fault classes in descending order of a weighted product or weighted total sum of the fault probability and a number of equivalent faults.

21. The circuit design device according to claim 8, further comprising a timing analyzer for extracting an interconnection having a small operation margin against delay time, wherein the placement deciding unit decides the placement of the elements and the interconnections while excluding the interconnection extracted by the timing analyzer.

22. The circuit design device according to claim 8, wherein the equivalent fault class selecting unit selects an equivalent fault class on a basis of a COP (Controllability Observability Procedure), 1-controllability, a CRF (Cost Reduction Factor), an EFC (Expected Fault Coverage), or a value obtained by converting a weighted product or a weighted total sum of a combination thereof and a number of equivalent fault interconnections, the 1-controllability, the CRF, and the EFC being included as parameters constituting the COP.

23. The circuit design device according to claim 1, wherein the placement deciding unit decides the placement of the elements and the interconnections for an equivalent fault class, of the equivalent fault classes, having a certain number of equivalent faults, the certain number being within a predetermined range.

24. The circuit design device according to claim 1, wherein the number of equivalent fault classes whose placement is to be decided, the number of elements whose placement is to be decided, a method of calculating the fault probability, a method of calculating the weight, or a value of a parameter included in a calculation equation of the fault probability or the weight, is specified from outside.

* * * * *